United States Patent
Pozsgay et al.

(10) Patent No.: US 7,755,524 B2
(45) Date of Patent: Jul. 13, 2010

(54) METHOD FOR PERFORMING A DIGITAL TO ANALOG CONVERSION OF A DIGITAL SIGNAL, AND CORRESPONDING ELECTRONIC DEVICE

(75) Inventors: Andras Pozsgay, Contamine sur Arve (FR); Mounir Boulemnakher, Grenoble (FR); Frédéric Paillardet, Aix les Bains (FR)

(73) Assignees: STMicroelectronics N.V., Amsterdam (NL); STMicroelectronics S.A., Montrouge (FR)

( * ) Notice: Subject to any disclaimer, the term of this patent is extended or adjusted under 35 U.S.C. 154(b) by 118 days.

(21) Appl. No.: 12/208,966

(22) Filed: Sep. 11, 2008

(65) Prior Publication Data

US 2009/0073013 A1     Mar. 19, 2009

(30) Foreign Application Priority Data

Sep. 14, 2007    (EP)    .................. 07301366

(51) Int. Cl.
  H03M 3/00  (2006.01)
  H03M 1/66  (2006.01)
  H04L 27/00  (2006.01)

(52) U.S. Cl. .................. 341/143; 341/144; 375/295

(58) Field of Classification Search .................. 341/143, 341/144; 375/295
  See application file for complete search history.

(56) References Cited

U.S. PATENT DOCUMENTS

| 7,212,585 B2 * | 5/2007 | Cho et al. ............ 375/298 |
| 7,471,226 B2 * | 12/2008 | Norsworthy et al. ....... 341/144 |
| 7,528,754 B1 * | 5/2009 | Bakkaloglu et al. ........ 341/143 |
| 2005/0200508 A1 * | 9/2005 | Hitko .................. 341/144 |
| 2006/0164273 A1 | 7/2006 | Hickling ............... 341/143 |
| 2007/0262893 A1 * | 11/2007 | Li et al. ............... 341/144 |

FOREIGN PATENT DOCUMENTS

| EP | 2037584 A1 * | 3/2009 |
| WO | WO96015585 | 5/1996 |
| WO | WO2005015752 | 2/2005 |
| WO | WO2005015753 | 2/2005 |
| WO | 2006/117590 | 11/2006 |

OTHER PUBLICATIONS

Susan Luschas, "Radio Frequency Digital-to-Analog Converter", IEEE Journal of Solid-State Circuits, vol. 39, No. 9, Sep. 2004, pp. 1462-1467.

(Continued)

*Primary Examiner*—Howard Williams
(74) *Attorney, Agent, or Firm*—Lisa K. Jorgenson; Allen, Dyer, Doppelt, Milbrath & Gilchrist, P.A.

(57) ABSTRACT

A method for processing a digital signal includes an elementary processing including a radiofrequency transposition with a radiofrequency transposition signal and a digital to analog conversion of the transposed digital signal for delivering a radiofrequency analog signal. The digital to analog conversion is controlled by a control signal and a power control signal, the control signal having a frequency twice the frequency of the radiofrequency transposition signal. Each transition of the radiofrequency transposition signal occurs between two consecutive pulses of said control signal.

26 Claims, 10 Drawing Sheets

OTHER PUBLICATIONS

Taleie et al., "A Bandpass δρ RF-DAC with Embedded FIR Reconstruction Filter", Arizona State University, Tempe, AZ, ISSCC 2006, Session 31, Very High Speed ADCs and DACs, 31.7.

Rode et al, "Transmitter Architecture Using Digital Generation of RF Signals", University of California, San Diego, LaJolla, CA, IEEE, 2003, pp. 245-248.

Ribner, "Multistage Bandpass Delta Sigma Modulators", 8090B IEEE Transactions on Circuits and Systems II: Analog and Digital Signal Processing, Jun. 1994, vol. 41, No. 6., New York, US, pp. 402-405.

Eloranta et al.," Direct-Digital RF Modulator IC in 0.13μm CMOS for Wide-Band Multi-Radio Applications", ISSCC 2005, Session 29, RF Techniques, 29.2, Feb. 9, 2005, pp. 532-533, 615.

* cited by examiner

METHOD FOR PERFORMING A DIGITAL TO ANALOG CONVERSION OF A DIGITAL SIGNAL, AND CORRESPONDING ELECTRONIC DEVICE

FIELD OF THE INVENTION

The invention relates to the processing of digital signals, in particular the digital to analog conversion of such signals delivered by sigma-delta modulation means or circuitry.

BACKGROUND OF THE INVENTION

A non-limitative application is directed to a wireless apparatus, in particular cellular mobile phones, and is especially adapted to the requirements of the W-CDMA, WiFi and WiMAX cellular and wireless standards.

Generally speaking, the transmission chain of a wireless apparatus, for example a mobile phone, comprises a digital stage and an analog front-end-module coupled to an antenna. The digital stage and the front-end module are mutually coupled through a digital to analog conversion stage.

In order to reduce the number of bits in the digital to analog conversion stage, a high frequency sigma-delta modulator is used.

SUMMARY OF THE INVENTION

According to an embodiment, it is proposed a radiofrequency digital to analog converter (RF DAC) which combines the digital signal and the radiofrequency transposition signal and generates a modulated radiofrequency analog signal whose power is proportional to a referenced current. Thus, the radiofrequency analog signal is delivered at a desired power level that is sufficient to drive a power amplifier, for example.

When the radiofrequency transposition signals are obtained by frequency division, this leads to a resulting phase noise relatively high as well as to a poor quality of the transposed signal. Thus, according to an embodiment, it is proposed a method and a device which can remedy to this disadvantage.

According to another embodiment, it is also proposed a device which offers the following advantages:

- it can be easily integrated in advanced digital CMOS technologies, without the need of special RF or analog options, this means that full SoC (System on Chip) solutions can be developed putting together the digital BaseBand and RF parts of a radio system,
- it can be easily ported to CMOS processes like 45 or 32 nm,
- the power consumption of this embodiment, integrated in state-of-the-art technologies like 65 nm CMOS, is at a similar level as that of the analog RF solutions, and may decrease using technologies like 45 or 32 nm CMOS,
- the silicon area is smaller than that of the analog RF solutions,
- there may be no analog base band (BB) circuitry, thus the nonlinearities and noises associated to analog filters, mixers, etc. may not be present and it is easier to design the circuit to satisfy the linearity and noise requirements of a given radio system.

According to another embodiment, it is proposed to use a radiofrequency digital to analog converter (DAC) array allowing to place notches in the DAC transfer function, thus to reduce the quantization noise in critical frequency bands.

Such an embodiment is, for example, directed to a wireless apparatus operating with two or more radio-systems simultaneously, for example one connectivity system like WiFi or WiMAX, and one cellular system in the DCS, PCS or W-CDMA bands.

According to another embodiment, it is also proposed to allow the use of a much simpler sigma-delta modulator, e.g. one with cascaded first order stages, which can be realized at much higher clock frequencies without increasing too much the power consumption.

According to an aspect, it is proposed an electronic device comprising a radiofrequency digital to analog conversion block having block input means or circuitry adapted to receive a digital signal containing at least one stream of successive bits and block output means or circuitry adapted to deliver a radiofrequency analog signal, the block including at least one cell having first input means or circuitry coupled to the block input means, second input means or circuitry adapted to receive a radiofrequency transposition signal, third input means or circuitry adapted to receive a control signal having a frequency twice the frequency of the radiofrequency transposition signal, each transition of the radiofrequency transposition signal occurring between two consecutive pulses of the control signal, fourth input means or circuitry adapted to receive a power control signal, cell output means or circuitry coupled to the block output means or circuitry, transposition means or circuitry coupled to the first input means or circuitry and to the second input means or circuitry and adapted to perform a radiofrequency transposition of the digital signal, and conversion means or circuitry controllable by the control signal and the power control signal and adapted to receive the transposed digital signal and to perform a digital to analog conversion thereof for delivering a cell radiofrequency analog signal, the radiofrequency signal being obtained from the cell radiofrequency signal.

Controlling the digital to analog conversion means or circuitry by the control signal which has the above-mentioned characteristics, in particular a frequency twice the frequency of the radiofrequency transposition signal, permits to reduce the phase noise of the transposed digital signal and to improve the quality of the digital transposed signal.

Further, when the digital signal is a multibit signal, controlling the cells of the digital to analog conversion block with the control signal permits to synchronize the several cells.

According to an embodiment, the electronic device further comprises generation means or circuitry, for example a Phase Locked Loop (PLL) adapted to deliver the control signal. Thus, a frequency divider, for example, may be adapted to receive the control signal and to deliver the radiofrequency transposition signal. When the radiofrequency transposition signal has a delay with respect to the control signal, the delay is preferably smaller than the half of the period of the control signal.

According to an embodiment, the conversion means or circuitry comprises first switching means or circuitry adapted to be controlled by the control signal, and second switching means or circuitry adapted to be controlled by the transposed digital signal.

According to another embodiment, the conversion means or circuitry comprises a logic circuit adapted to receive the control signal and the transposed digital signal and to deliver a combined control signal, and switching means or circuitry controlled by the combined control signal.

According to an embodiment, the transposition means or circuitry comprises mixing means or circuitry controlled by the radiofrequency transposition signal.

According to an embodiment wherein the digital signal contains several parallel streams of bits, (i.e. the digital signal is a multibit signal), the radiofrequency digital to analog conversion block includes several cells adapted to respectively receive the several parallel streams of bits, the several second, third, fourth input means or circuitry and the several cell output means or circuitry of the several cells being respectively mutually coupled; the block output means or circuitry is further coupled to the several cell output means or circuitry, and the radiofrequency analog signal is thus obtained from the several cell radiofrequency analog signals.

Depending on the "weight" of the bit of the digital signal to be processed by the corresponding cell, the cell may comprise several conversion means or circuits coupled in parallel. Thus cells having different "weights" can be obtained.

According to an embodiment, the electronic device may further comprise sigma-delta modulation means or circuitry having output means or circuitry adapted to deliver the digital data signal.

According to an embodiment, the sigma-delta modulation means or circuitry is adapted to operate with a clock signal, and the device further comprises a notch filter including at least two identical radiofrequency digital to analog conversion blocks, digital delay means (DM) or circuitry controlled by the clock signal and including a delay block coupled between the two first input means or circuits, the frequency of a notch of the notch filter being related to the delay's value of the delay block, and summation means or circuitry adapted to sum the radiofrequency analog signals.

Such an embodiment is, for example, directed to a wireless apparatus operating with two or more radio-systems simultaneously, for example one connectivity system like WiFi or WiMAX, and one cellular system in the DCS, PCS or W-CDMA bands.

According to an embodiment, the notch filter comprises N identical radiofrequency digital to analog conversion blocks, N being greater than or equal to 2, and the digital delay means or circuitry includes a chain of N−1 delay blocks respectively coupled between the N first input means or circuitry of the N digital to analog blocks.

In other words, instead of one RF DAC, several RF DACs are coupled to a chain of (at least one) delay blocks. The delay blocks operate with the same clock as the one used by sigma-delta modulation means or circuitry. Further, the digital to analog conversion means or circuits may be identical, thus easier to build. And, as all the coefficients of the filter are positive, the useful signal amplitude is the sum of the DAC signal amplitudes. There may thus be no signal power loss due to negative coefficients.

The positions of the notches of the notch filter, i.e. the frequencies of the notches, are related to the delay values of the delay blocks.

Thus, a notch filter is provided whereby the quantization noise in the desired frequency bands (for example the DCS, PCS or W-CDMA receive bands) is reduced.

The ripple level of the output summed radiofrequency analog signal depends on the values of the delays. The man skilled in the art will be able to choose these delays values depending on the acceptable ripple level depending on the application.

However, an acceptable approach may be choosing the delay's value of the delay means or circuitry, smaller than 1/(10*BW), and preferably smaller than 1/(30*BW), where BW is the frequency bandwidth of the summed radiofrequency analog signal.

Additional flexibility can be added by making the delays programmable. In this case, the best position of the notches can be chosen as a function of, for example, the transmission carrier frequency, and the actual coexistence requirements in the mobile phone.

This flexibility reduces further the transmission filtering requirements. The electronic device may be realized within an integrated circuit. According to another aspect, it is proposed a wireless apparatus including an electronic device, as defined above.

According to another aspect, it is proposed a method for processing a digital signal, comprising an elementary processing including a radiofrequency transposition with a radiofrequency transposition signal and a digital to analog conversion of the transposed digital signal for delivering a radiofrequency analog signal, the digital to analog conversion being controlled by a control signal and a power control signal, the control signal having a frequency twice the frequency of the radiofrequency transposition signal, each transition of the radiofrequency transposition signal occurring between two consecutive pulses of the control signal.

According to an embodiment, the digital signal is delivered by sigma-delta modulation means or circuitry operating with a clock signal, and further comprising delaying the digital signal using the clock signal for obtaining at least one delayed digital signal, the frequency of a notch of the notch filter being related to the delay's value, processing the digital signal and the delayed digital signal with the elementary processing and summing all the radiofrequency analog signals.

According to an embodiment, delaying the digital signal comprises successively delaying the digital signal with several respective delays for obtaining at least two different delayed signals, and the method comprises processing the digital signal and all the delayed signal with the identical processing, and summing the radiofrequency analog signals.

Each delay's value may be programmable.

BRIEF DESCRIPTION OF THE DRAWINGS

Other advantages and features of the invention will appear on examining the detailed description of embodiments, these being in no way limiting, and of the appended drawings in which.

DETAILED DESCRIPTION OF THE PREFERRED EMBODIMENTS

Figure 1:
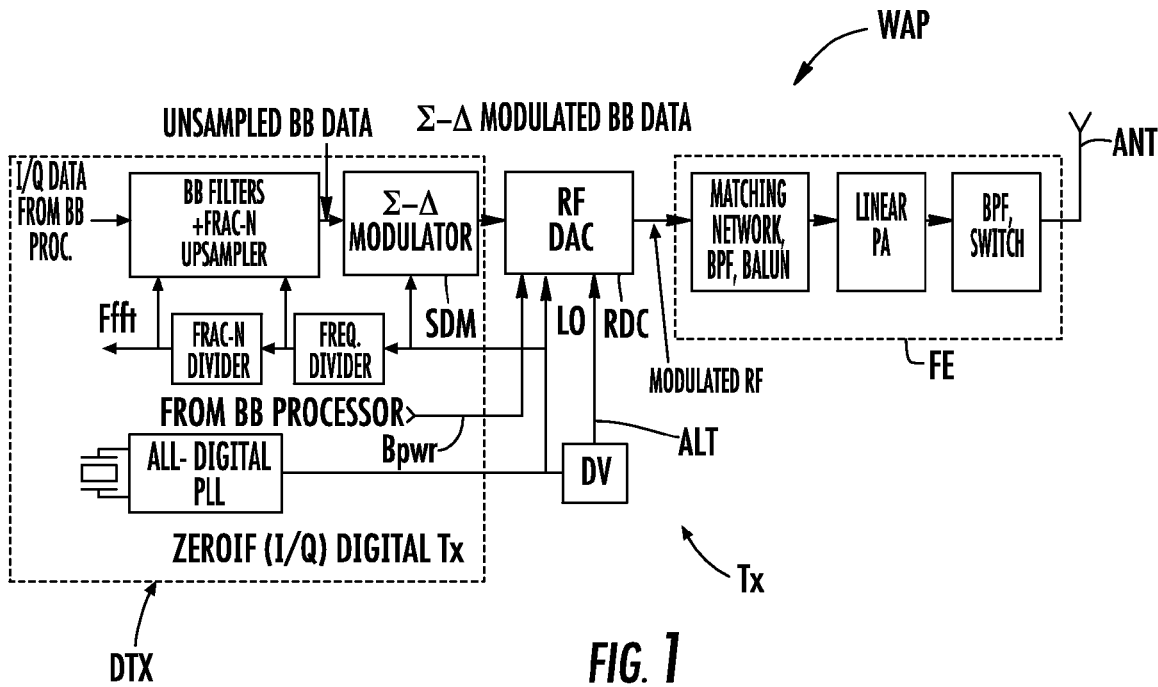
FIG. 1 illustrates diagrammatically an example of an electronic device according to the invention, incorporated in a wireless apparatus.

FIG. 1 illustrates diagrammatically an example of a transmission chain TX of a wireless apparatus WAP, such as a mobile phone.

The transmission chain comprises a digital stage DTX connected through a single radiofrequency digital to analog converter RDC, to an analog front end stage FE. The front end stage FE is coupled to an antenna ANT.

The digital stage DTX comprises low and high frequency digital logic, whose task is to change the sampling rate of the base-band (BB) signal delivered by a base-band processor, from Ffft (Base-Band Sampling Frequency, in the range of a few MHz) to Fc (Fcarrier) or a multiple of Fc, in the range of a few hundred MHz to a few GHz.

This upsampled signal is then processed by a sigma-delta modulator (SDM) in order to represent the high resolution base-band signal using a reduced number of bits.

The front end stage comprises conventionally a matching network, bandpass filter (BPF), balun, as well as a linear power amplifier (PA) and other conventional elements. The block RDC performs both the radiofrequency transposition and the digital to analog conversion.

Further, the RF DAC block delivers the modulated radiofrequency analog signal at a desired power level, which is sufficient to drive the power amplifier PA.

In this respect, the RF DAC block RDC receives the digital signal (sigma-delta modulated Baseband data) as well as the radiofrequency transposition signal ALT having the carrier frequency Fc and another control signal LO which has a frequency twice the carrier frequency.

As it is usually the case in ZeroIF (direct conversion or intermediate frequency equal to zero) or lowIF (low intermediate frequency) transmitters, the control signal Lo is delivered by a Phase Locked Loop (PLL). Thus, for example, a divider DV performing a frequency division by two is provided receiving the control signal LO and delivering the radiofrequency transposition signal ALT having the carrier frequency Fc.

The radiofrequency digital to analog block RDC further receives a power control signal Bpwr delivered by the base band processor for adjusting the level of the radiofrequency modulated analog signal.

Figure 2:
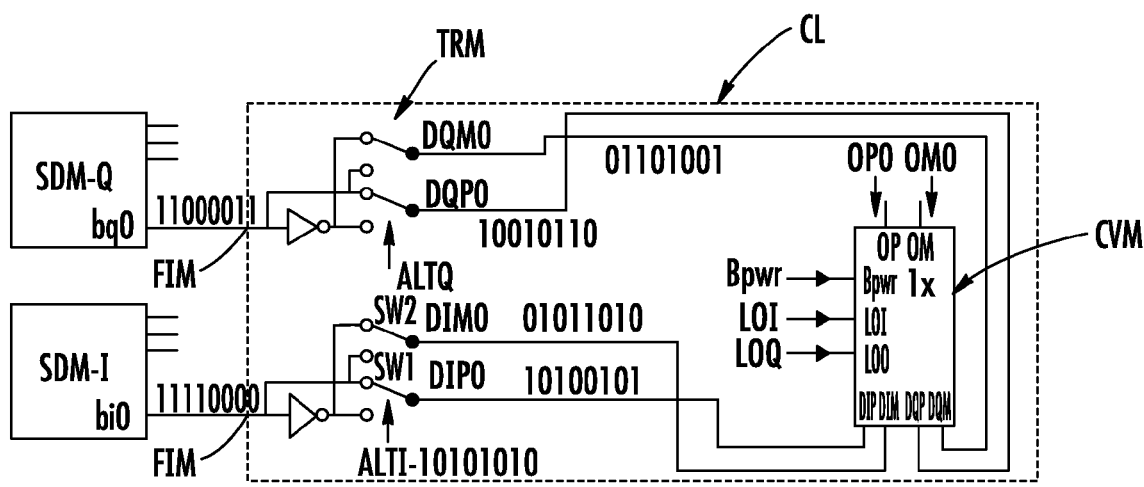
FIG. 2 illustrates more in details, but still diagrammatically, an example of a cell incorporated in a RF DAC block according to the invention.

As illustrated in FIG. 2, the digital signal delivered by the sigma-delta modulator SDM comprises conventionally the I channel and the Q channel. Further, in this example, the digital signal delivered by the sigma-delta modulator SDM is a multibit digital signal. A cell is associated to one stream of bits (bi0, bq0) delivered by the sigma-delta modulator.

The cell CL associated to the bit b0 (bi0, bq0) will be now disclosed more in detail, bearing in mind that the other cells respectively associated to the other streams of bits bi may be identical to the one which is now disclosed.

The cell CL comprises first input means or circuitry FIM which is also the block input means or circuitry of the block RDC.

The cell comprises transposition means or circuitry TRM which receive the digital signal and delivers a digital transposed signals DIP0, DIM0, DQP0, DQM0 at the carrier frequency Fc, which is also the frequency of the radiofrequency transposition signals ALTi, ALTq.

The digital transposed signal is then converted into a radiofrequency analog signal OP0, OM0 in digital to analog conversion means or circuitry CVM which are controlled by the control signal LO and the power control signal Bpwr.

The output means or circuitry OP, OM form here the cell output means or circuitry but also the RF block output means or circuitry when one cell is provided.

Further, for example, both cell output means or circuitry OP, OM are coupled to the supply voltage through a load and to the power amplifier PA through the other conventional elements of the front end module.

The structure disclosed here is a differential structure but is of course not limited to such a structure.

Figure 3:
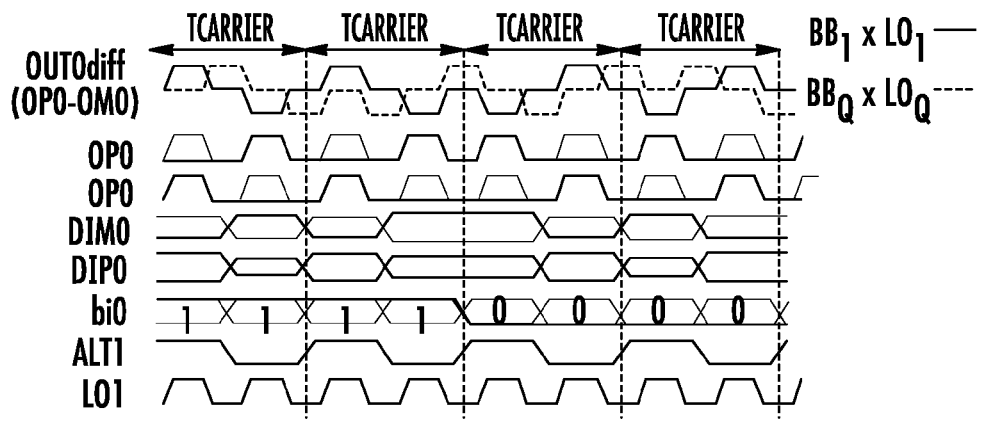
FIG. 3 illustrates timing diagrams of signals related to the embodiment of FIG. 2.

The operation of the cell CL is illustrated with the timing diagrams of FIG. 3. More precisely, the output bit bi0 coming from the I channel and its inverted signal, are coupled through two switches of the transposition means or circuitry TRM to the DIP and DIM data inputs of the conversion means or circuitry CVM.

The switches of the transposition means or circuitry are controllably commuted by the ALT signal to perform a digital mixing function between the Baseband digital signal delivered by the sigma-delta modulator and the radiofrequency transposition signal ALT.

As indicated above, the radiofrequency transposition signal is obtained by dividing the control signal LO by two. Further, each transition of the radiofrequency transposition signal ALT occurs between two consecutive pulses of the control signal LO.

An approach for obtaining such a result may be using a divider DV having a phase shift such that the radiofrequency transposition signal ALT has a phase shift with respect to the control signal LO being smaller than the half of the period of the control signal LO. The resulting analog radiofrequency signal OUT0diff (or $BB_I \times LO_I$) is the difference OP0−OM0 at the cell output OP, OM. The corresponding signal from the Q channel is shown in dotted line ($BB_Q \times LO_Q$).

Controlling the digital to analog conversion by using the control signal LO may not modify the frequency transposition but may reduce the phase noise of the signal, thus improving the quality of the digital transposed signal DIP, DIM, DQP, DQM. Further, when several cells are coupled to the output of the sigma-delta modulator SDM, the cells are controlled by the same control signal LO. Thus, a good synchronization between the several cells is provided.

Further, the control power signal Bpwr permits to adjust the level of the radiofrequency analog signal at the desired level.

Figure 9:
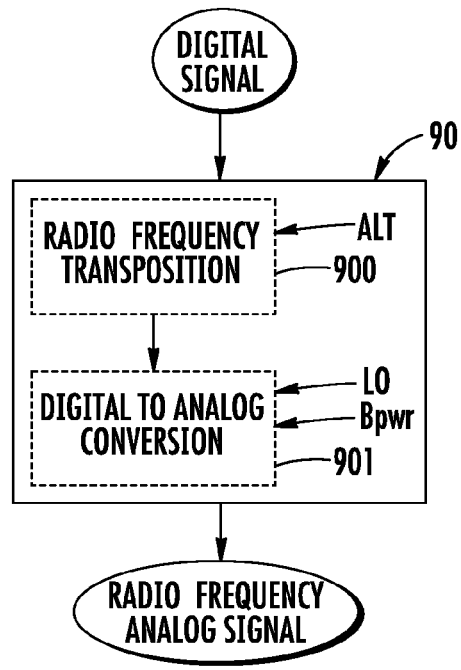
FIG. 9 illustrates diagrammatically a flow chart related to an embodiment of a method, according to the invention.

The elementary processing 90, performed by the cell CL is illustrated in FIG. 9 and comprises, as indicated above, a radiofrequency transposition 900 using the radiofrequency transposition signal ALT followed by a digital to analog conversion 901 controlled by the control signal LO and the power control signal Bpwr.

Several approaches exist for implementing the transposition means or circuitry TRM (mixing means or circuitry).

Figure 4:
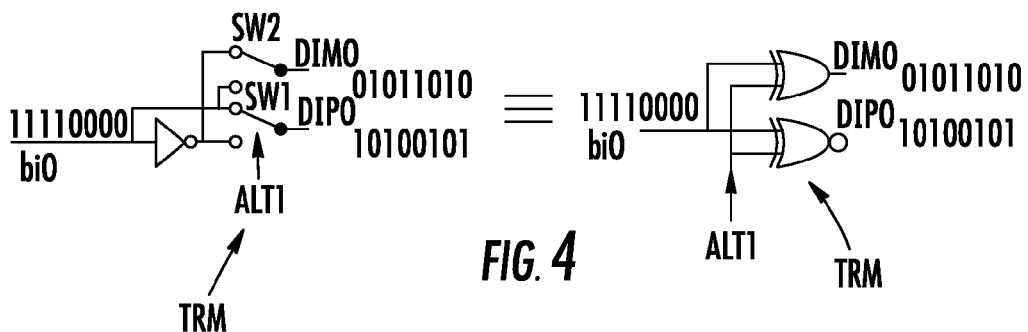
FIGS. 4-7 illustrate diagrammatically examples of different elements of a cell, according to the invention.

One approach is depicted diagrammatically in FIG. 4. In this figure, the switches are realized by XOR and XNOR gates as shown in the right part of FIG. 4.

Figure 5:
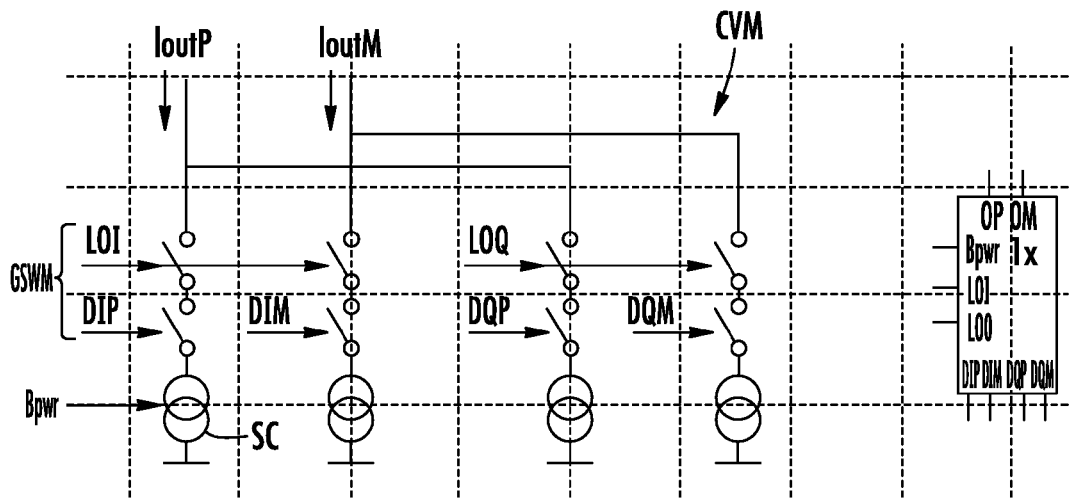

Turning now more particularly to FIG. 5, it can be seen that the digital to analog conversion means or circuitry CVM may be implemented using global switching means or circuitry GSWM controlled by the control signal LO and the digital transposed signal DIP, DIM, DQP, DQM.

These global switching means or circuitry GSWM are coupled to a current source SC controlled by the power control signal Bpwr and allow to deliver level-controlled current pulses at the cell output.

Figure 6:
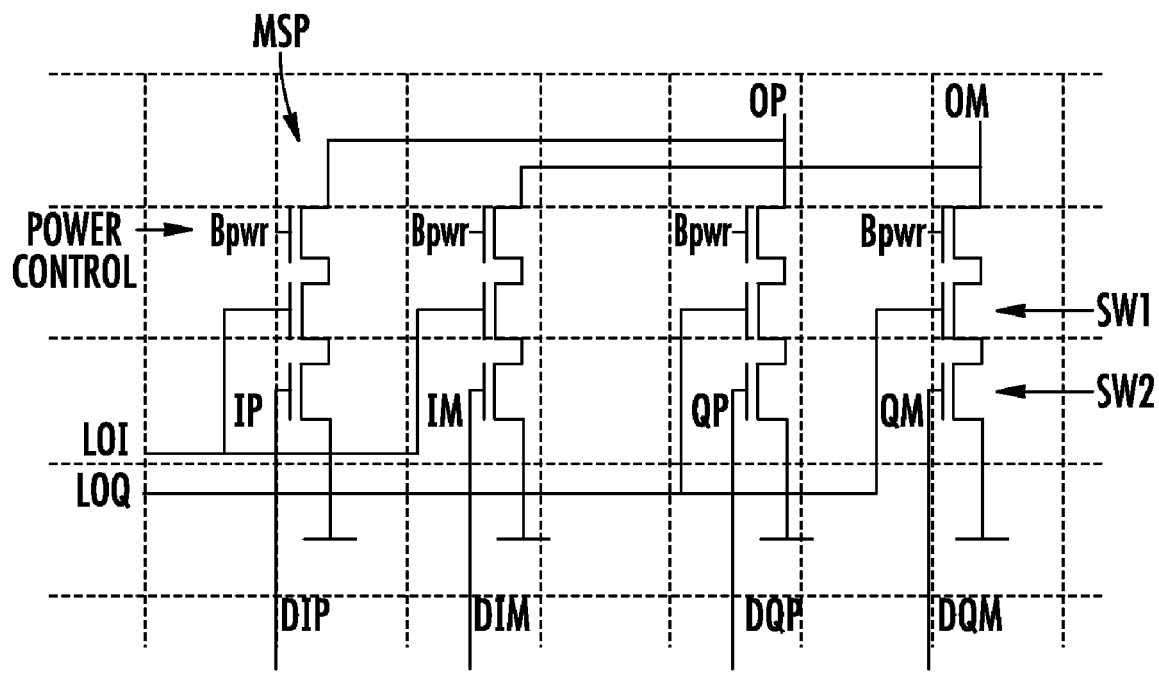
Figure 7:
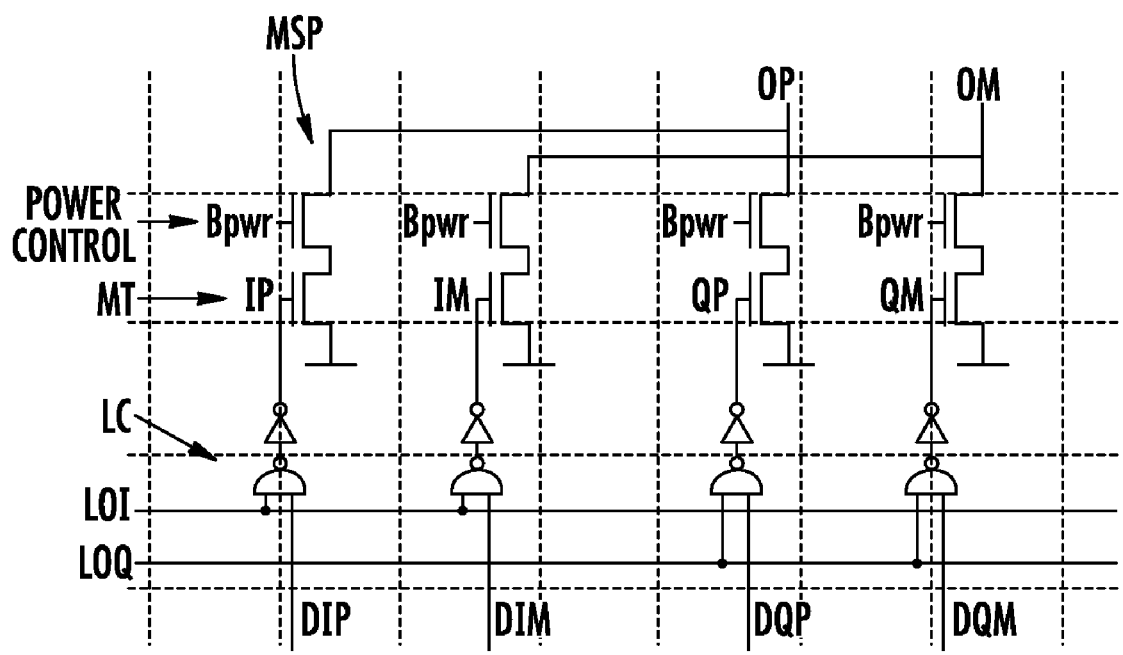

FIGS. 6 and 7 depict two possible circuit implementations of the conversion means or circuitry CVM, using CMOS technology.

The first one (FIG. 6) is using first switching means or circuitry SW1 (for example MOS transistors) controlled by the control signal LOI, LOQ, and second switching means or circuitry SW2 (MOS transistors) controlled by the digital transposed signal DIP, DIM, DQP, DQM.

These two switching means or circuits SW1 and SW2 are coupled in series to thus combine the data and LO signals in the same way as it is described in FIG. 5.

The advantage of this approach is that the phase noise of the modulated radiofrequency analog signal is determined by the LO phase noise only. The contribution of the cell is negligible.

A second approach is depicted in FIG. 7. In this approach, one MOS transistor MT per current switch is used, which is driven by a logic circuit LC (including here gate and inverter) that combines the data and LO signals.

This switch is smaller than the ones used in the first approach depicted in FIG. 6 and thus needs less driver power.

On these two approaches, other MOS transistors MSP are coupled between the switching means or circuitry and the cell output and are driven by the power control signal Bpwr such that, depending on the value of the power control signal, more or less current is delivered at the cell output.

Figure 8:
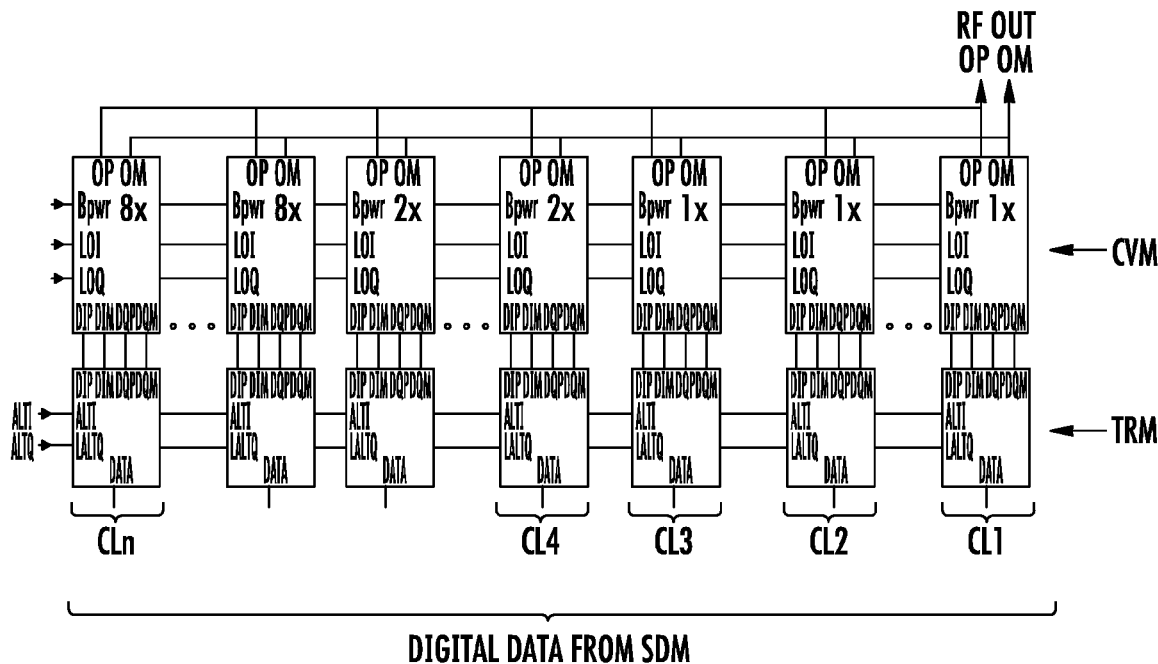
FIG. 8 illustrates another embodiment of a RF DAC block, according to the invention.

As illustrated in FIG. 8 and explained above, the digital to analog conversion block RDC comprises several cells CL1-CLn adapted to respectively process the several parallel streams of bits of the multi-bits signal delivered by the sigma-delta modulator SDM.

The cell output means or circuits OP, OM of the several cells are respectively mutually coupled and form the block output means or circuitry.

Thus, the RF modulated analog signal delivered from the RF block RDC is obtained from the several cell analog signal respectively delivered by the several cells. In the present example the cell analog signals (currents) are summed.

Further, the several second (ALT), third (LO), (Bpwr) input circuits of the several cells are also mutually coupled.

Further, depending on the "weight" of the bit of the digital word delivered by the sigma-delta modulator, the cell may have also a corresponding "weight".

For example, as illustrated in FIG. 8, for a LSB (Least Significant Bit) a cell having a "weight" equal to 1 (i.e. a cell as the one disclosed above) may be used. For a MSB (Most Significant Bit) a cell CLn having a "weight" equal to 8 may be used. In this respect, such cell may be realized by connecting 8 conversion means CVM in parallel.

Figure 10:
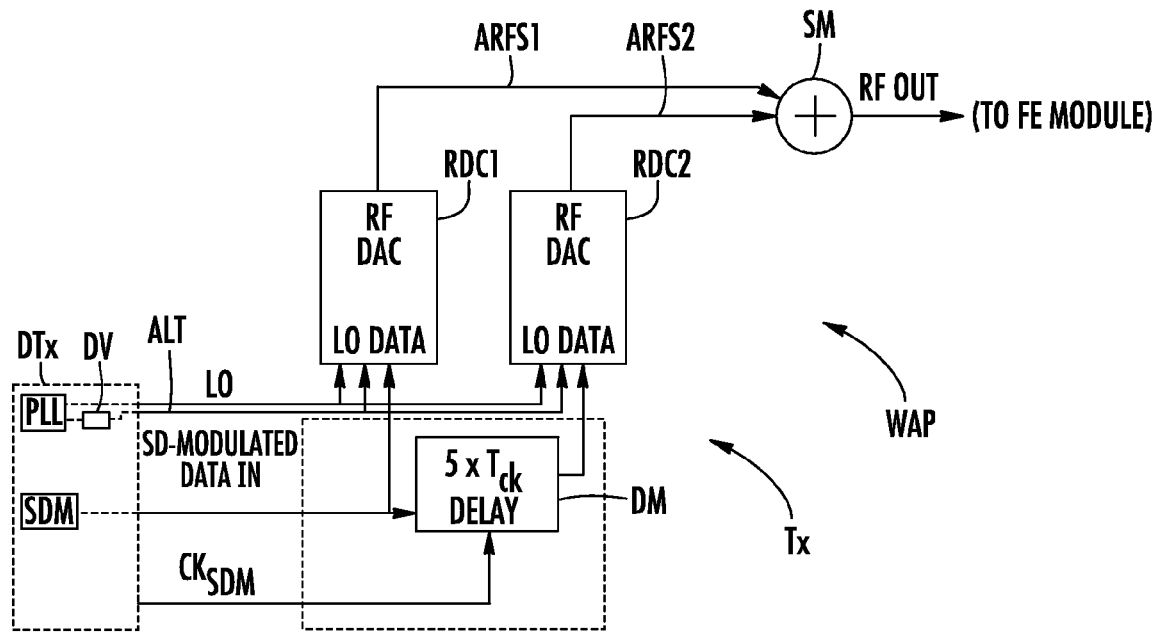
FIG. 10 illustrates an example of a device according to another embodiment of the present invention.

The examples illustrated in FIG. 10 and following will permit to realize a notch filter allowing to place the notches around a desired band (for example the DCS, PCS or W-CDMA receive band), in order to reduce the filtering requirements of the transmission chain TX.

The example illustrated in FIG. 10 comprises in the transmitting chain Tx of the wireless apparatus WAP, instead of one RF DAC (block RDC), two identical RF DACs RDC1 and RDC2, both receiving the control signal LO at their LO input (second input means or circuitry), and the radiofrequency transposition signal ALT at their third input means or circuitry.

A delay block DM is coupled between the two data inputs of the RF DACs RDC1 and RDC2. This delay block DM is clocked by the clock signal $CK_{sdm}$ with which the sigma-delta modulator is operated. The value of the delay is a multiple of the clock period $T_{ck}$ of the clock signal $CK_{sdm}$. In the present case, the value of the multiple is equal to 5.

Whereas the data input of the first RF DAC RDC1 is directly coupled to the output of the sigma-delta modulator SDM, the data input of the second RF DAC RDC2 is coupled to the output of the sigma-delta-modulator SDM through the delay block DM.

The two RF DACs RDC1 and RDC2 respectively deliver two radiofrequency analog signals ARFS1 and ARFS2, which are summed in summation means or circuitry SM in order to deliver a summed analog signal RF OUT which is delivered to the front end module FE. The summation is here a summation in current.

Figure 12:
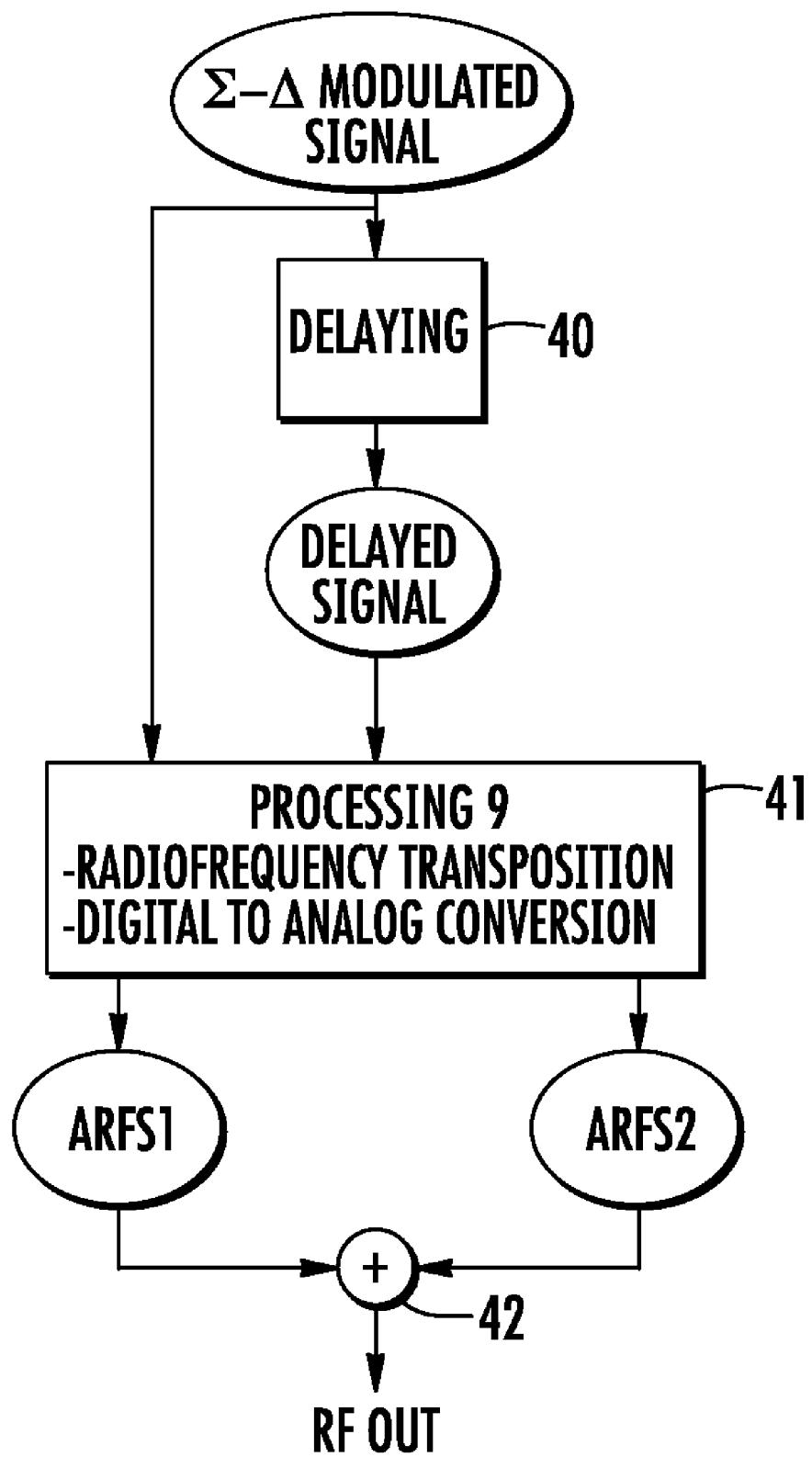
FIG. 12 illustrates diagrammatically a flow chart corresponding to another example of a method according to the invention.

The operation of the device illustrated in FIG. 10 is depicted in FIG. 12. The sigma-delta modulated signal is delayed (step 40) in the delay block DM and both the sigma-delta modulated signal and the delayed signal are processed in the two RF DACs blocks RDC1 and RDC2 (step 41).

The elementary processing 9 (step 41) is identical for both signals, and has been depicted in FIG. 9.

The frequency of the notch of the notch filter in the Baseband is related to the delay's value of the delay block. More precisely, the frequency of the notch in the Baseband is equal to $F_{ck}/2n$, where Fck designates the frequency of the clock signal CKsdm and n designates the value of the multiple used in the delay block. In the present case, n is equal to 5.

After frequency transposition to the carrier frequency Fc, the summed radiofrequency analog signal RF OUT (step 42) comprises two notches having respectively the frequencies $F_c-f0$ and $F_c+f0$, where f0 is the frequency of the notch in the Baseband.

In the present example, the circuit of FIG. 10 is designed to operate using for example a 802.11 g (WiFi) baseband signal as input. The modulation is, for example, a 64 QAM OFDM. The carrier frequency is equal to 2.4 GHz and the Phase Locked Loop (PLL) and the high speed logic operate at a frequency equal to twice the carrier frequency, i.e. to 4.8 GHz.

Thus, after frequency transposition, the signal comprises two notches NTCH1 et NTCH2 (FIG. 11), respectively placed at 1.92 and 2.88 GHz. For the present application only the first notch NTCH1 is useful, as it is placed near the PCS receive band.

Figure 11:
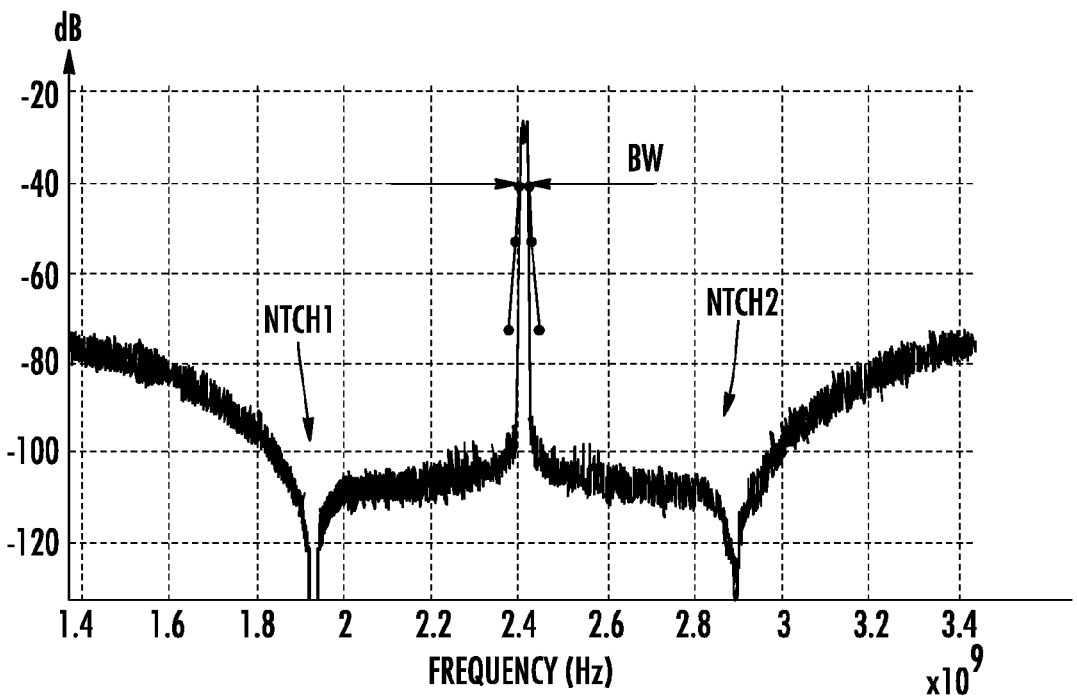
FIG. 11 illustrates two notches resulting from the notch filter illustrated in FIG. 10.

In order to avoid too much ripple in the radiofrequency analog output signal RF OUT, it is preferable that the notches are placed as for as possible from the carrier frequency. This can be obtained by adjusting the value of the delay, so that this value is smaller than 1/(30*BW), where BW is the frequency bandwidth of the summed radiofrequency analog signal RF OUT (FIG. 11). However, this threshold is only indicative and the man skilled in the art would be able to adjust it depending on the application.

Generally speaking, the notch filter may comprise N identical radiofrequency digital to analog conversion blocks, N being greater than or equal to 2, and the digital delay means or circuitry may thus include a chain of N−1 delay blocks respectively coupled between the N data inputs of the radiofrequency digital to analog conversion blocks.

Figure 13:
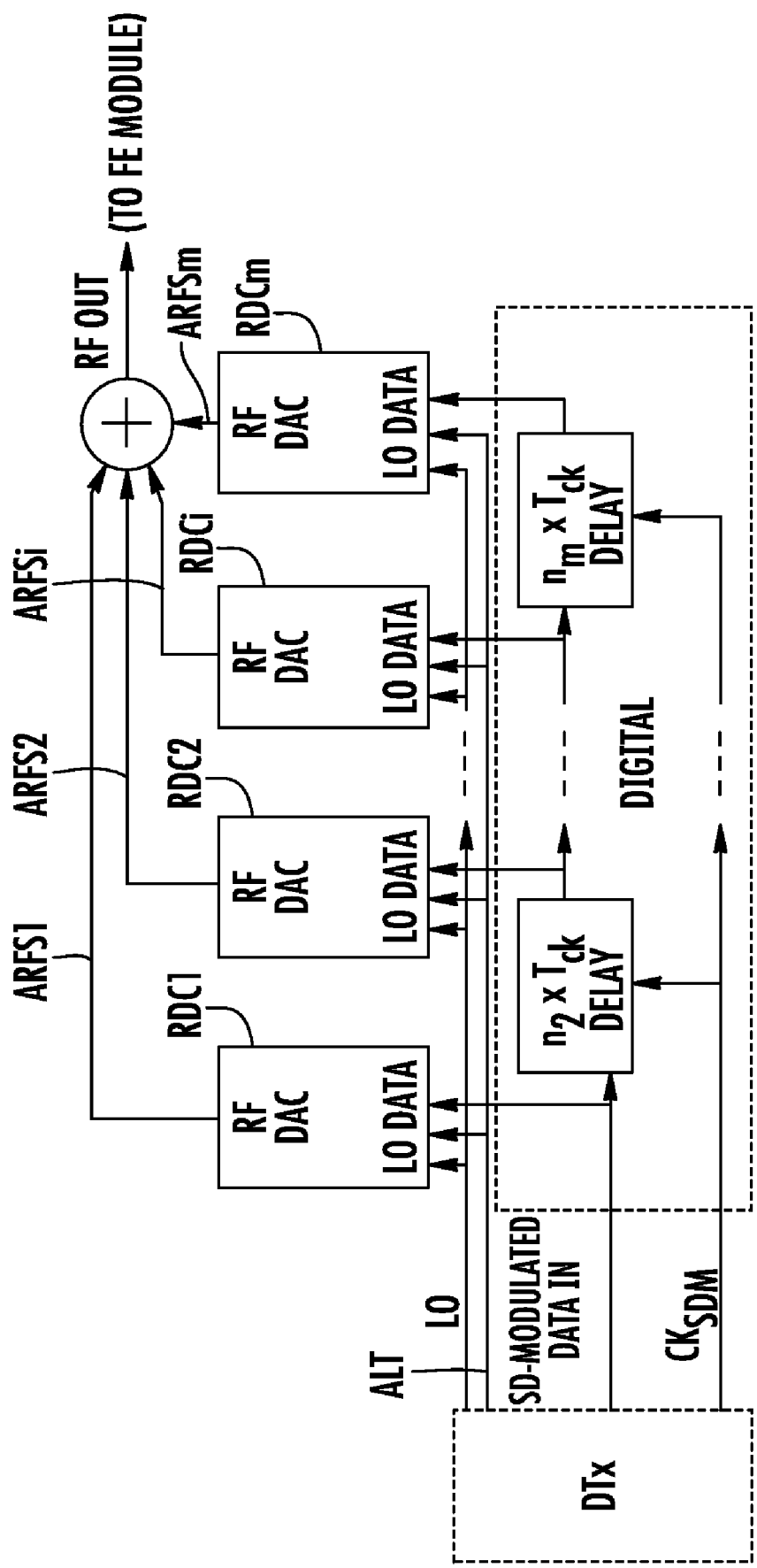
FIGS. 13 to 18 illustrate diagrammatically other examples and embodiments of a device and a method, according to the invention.

Such an embodiment is illustrated in FIG. 13, where m RF DAC blocks RDC1-RDCm are illustrated, using delay means or circuitry DM including a chain of m−1 delay blocks. Each RF DAC block RDCi delivers a radiofrequency analog signal ARFSi.

Figure 14:
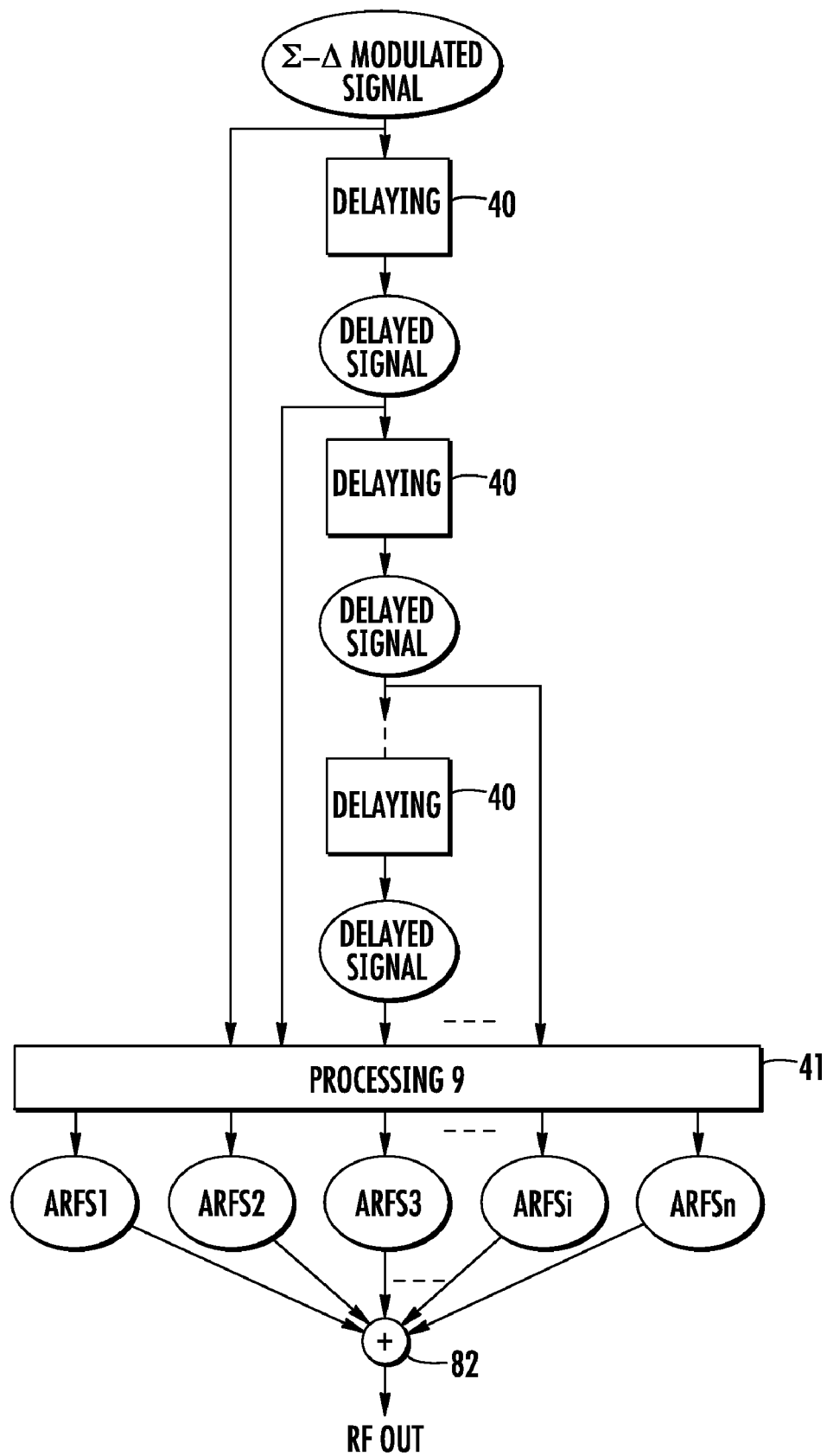

The operation of such an embodiment is illustrated diagrammatically in FIG. 14.

The delta-sigma modulated signal is successively delayed in the delay blocks (step 40) and the delta-sigma modulated signal and delayed signals are processed (step 41) by using the identical elementary processing 9 illustrated and disclosed in FIG. 9.

The radiofrequency analog signals ARFSi are summed in the summation means or circuitry (step 82) in order to obtain the summed radiofrequency analog signal RF OUT.

Figure 15:
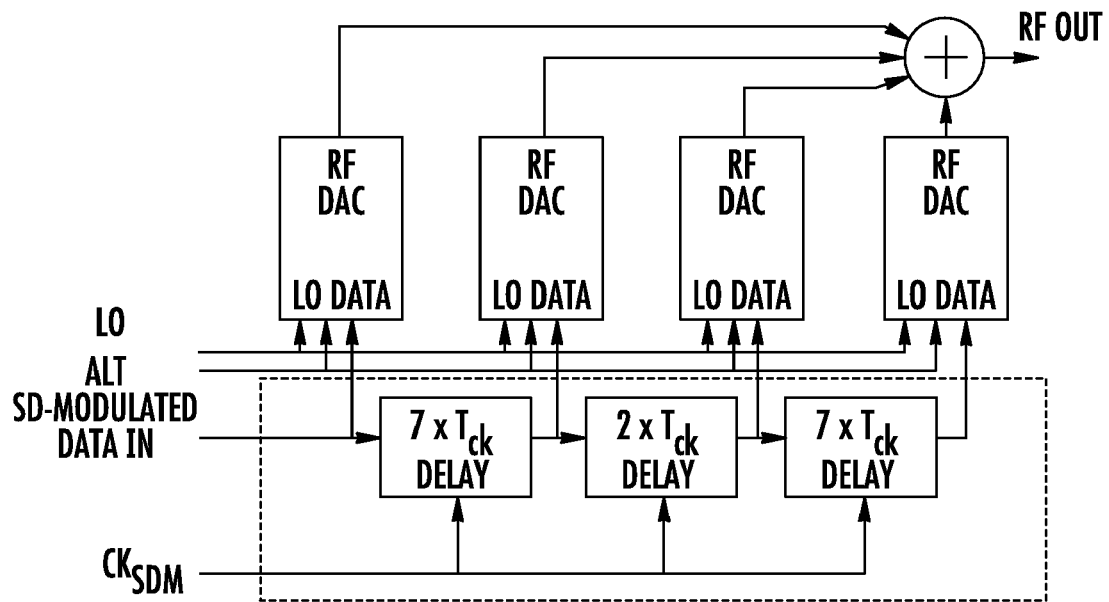
Figure 16:
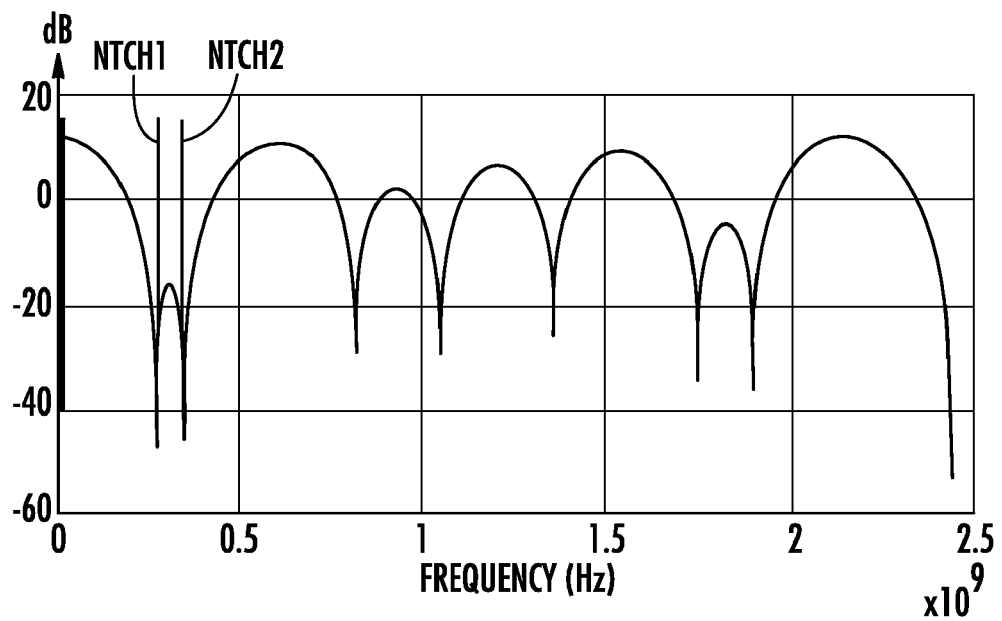

An example of such a notch filter is illustrated in FIG. 15, using four RF DAC blocks and three delay blocks having respectively delays values equal to $7T_{ck}$, $2T_{ck}$ and $7T_{ck}$. The filter transfer function of this notch filter in baseband is illustrated in FIG. 16 and comprises two notches NTCH1 and NTCH2 around 280 and 340 MHz, as well as the other notches which are replicas of these two notches.

Figure 17:
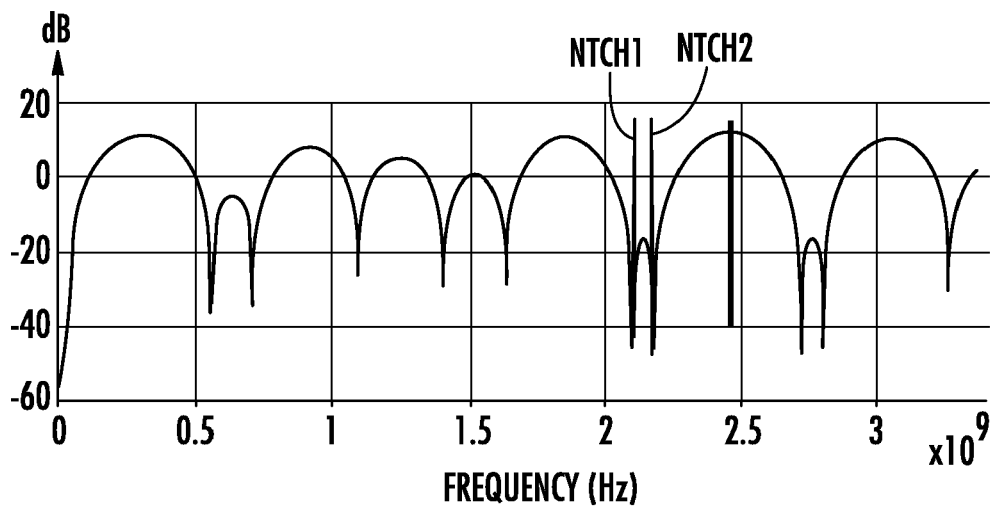
Figure 18:
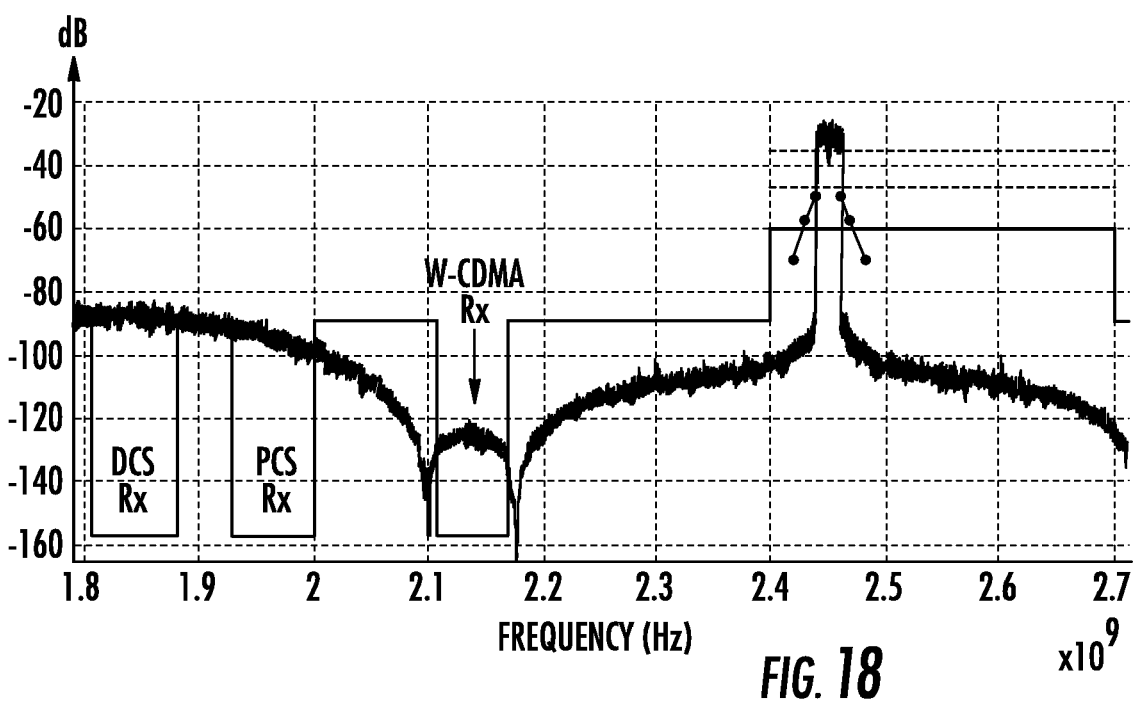

The carrier frequency is equal to 2.45 GHz in this example. The transfer function is transposed around the carrier frequency as shown in FIG. 17 and the two notches are now placed around 2.1 and 2.2 GHz, i.e. around the WCDMA receiving band (FIG. 18), thus reducing the filter requirements from 70 to 40 dBs in this band.

It is also particularly advantageous that the values of the delays may be programmable, so that it is possible to place the notches within the WCDMA receiving band or the PCS receiving band or the DCS receiving band depending on the application.

That which is claimed is:

1. An electronic device comprising:
    a radiofrequency (RF) digital to analog conversion block comprising
        a block input to receive a digital signal,
        a block output to deliver an RF analog signal,
        at least one cell comprising
            a first input coupled to the block input,
            a second input to receive an RF transposition signal,
            a third input to receive a control signal having a frequency greater than a frequency of the RF transposition signal, each transition of the RF transposition signal occurring between two consecutive pulses of the control signal,
            a fourth input to receive a power control signal,
            a cell output coupled to said block output,
            transposition circuitry coupled to said first and second inputs and to generate a transposed digital signal, and
            conversion circuitry, controllable by the control signal and the power control signal, to receive the transposed digital signal and to perform a digital to analog conversion thereof to the RF analog signal to the block output.

2. An electronic device according to claim 1, wherein the control signal has a frequency at least twice that of the frequency of the RF transposition signal.

3. An electronic device according to claim 1, further comprising generation circuitry to deliver the control signal and a frequency divider to receive the control signal and deliver the RF transposition signal having a delay with respect to the control signal, the delay being smaller than half of a period of the control signal.

4. An electronic device according to claim 1, wherein said conversion circuitry comprises first switching circuitry to be controlled by the control signal and second switching circuitry to be controlled by the transposed digital signal.

5. An electronic device according to claim 4, wherein said conversion circuitry comprises a logic circuit to receive the control signal and the transposed digital signal and to deliver a combined control signal, and switching circuitry controlled by the combined control signal.

6. An electronic device according claim 1, wherein said transposition circuitry comprises mixing circuitry controlled by the RF transposition signal.

7. An electronic device according to claim 1, wherein the digital signal contains a plurality of parallel streams of bits and said RF digital to analog conversion block includes a plurality of cells to respectively receive the plurality of parallel streams of bits, said second, third, and fourth inputs, and outputs of said plurality of cells being respectively mutually coupled, said block output being coupled to said output of said plurality of cells, the RF analog signal being obtained from the plurality of cell RF analog signals.

8. An electronic device according to claim 7, wherein at least one cell comprises a plurality of conversion circuits coupled in parallel.

9. An electronic device according to claim 1, further comprising a sigma-delta modulator deliver the digital signal to said RF digital to analog conversion block.

10. An electronic device according to claim 9, wherein said sigma-delta modulator operates with a clock signal; and further comprising a notch filter including at least two identical RF digital to analog converters (DACs), digital delay circuitry controlled by the clock signal, and a delay block coupled between first inputs of the DACs, the frequency of a notch of said notch filter being based upon to a delay value of said delay block, and a summer to sum the RF analog signals.

11. An electronic device according to claim 10, wherein said notch filter comprises N identical radiofrequency DACs; and wherein said digital delay circuitry includes a chain of N−1 delay blocks respectively coupled between the inputs of said N identical RF DACs.

12. An electronic device according to claim 10, wherein a delay value of said delay circuitry is smaller than (1/(30*BW)), where BW is a frequency band width of the radiofrequency analog signal.

13. An electronic device according to claim 10, wherein said delay circuitry comprises programmable delay circuitry.

14. An electronic device according to claim 1, realized within an integrated circuit.

15. An electronic device according to claim 1, wherein the RF digital to analog conversion block defines a wireless apparatus.

16. An electronic device to receive a digital signal and a radiofrequency transposition signal comprising:
    transposition circuitry to generate a transposed digital signal based upon the digital signal and the RF transposition signal; and
    a digital to analog converter (DAC) to generate an RF analog signal based upon the transposed digital signal;
    the DAC being controlled by a control signal having a frequency greater than a frequency of the RF transposition signal, each transition of the RF transposition signal occurring between two consecutive pulses of the control signal.

17. An electronic device according to claim 16, wherein the control signal has a frequency at least twice that of the frequency of the RF transposition signal.

18. An electronic device according to claim 16, further comprising generation circuitry to generate the control signal and a frequency divider to receive the control signal and generate the RF transposition signal having a delay with respect to the control signal, the delay being smaller than half of a period of the control signal.

19. An electronic device according to claim 16, wherein said DAC comprises first switching circuitry to be controlled by the control signal and second switching circuitry to be controlled by the transposed digital signal.

20. An electronic device according to claim 18, wherein said DAC comprises a logic circuit to receive the control signal and the transposed digital signal and to generate a combined control signal, and switching circuitry controlled by the combined control signal.

21. An electronic device according claim 16, wherein said transposition circuitry comprises mixing circuitry controlled by the RF transposition signal.

22. A method for processing a digital signal comprising:
performing an elementary processing including an RF transposition with an RF transposition signal and a digital to analog conversion of the transposed digital signal to deliver an RF analog signal,
the digital to analog conversion being controlled by a control signal and a power control signal, the control signal having a frequency being greater than a frequency of the RF transposition signal, each transition of the RF transposition signal occurring between two consecutive pulses of the control signal.

23. A method according to claim 22, wherein the control signal has a frequency at least twice that of the frequency of the RF transposition signal.

24. A method according to claim 22, wherein the digital signal is delivered by a sigma-delta modulator operating with a clock signal; and further comprising delaying the digital signal using the clock signal to obtain at least one delayed digital signal, the frequency of a notch of the notch filter being based upon a delay value of the at least one delayed digital signal, processing the digital signal and the delayed digital signal with the elementary processing, and summing the RF analog signals.

25. A method according to claim 24, wherein delaying the digital signal comprises successively delaying the digital signal with a plurality of respective delays to obtain a plurality of different delayed signals, processing the digital signal by elementary processing, and summing the RF analog signals.

26. A method according to claim 25, wherein the delay value is programmable.

* * * * *

UNITED STATES PATENT AND TRADEMARK OFFICE
CERTIFICATE OF CORRECTION

| | |
|---|---|
| PATENT NO. | : 7,755,524 B2 |
| APPLICATION NO. | : 12/208966 |
| DATED | : July 13, 2010 |
| INVENTOR(S) | : Pozsgay et al. |

It is certified that error appears in the above-identified patent and that said Letters Patent is hereby corrected as shown below:

| | |
|---|---|
| Cover Page (75), Inventor, Line 1 | Delete: "sur"<br>Insert: -- Sur -- |
| Column 1, Line 40 | Delete: "to" |
| Column 3, Line 63 | Delete: "delays"<br>Insert: -- delay -- |
| Column 4, Line 37 | Delete: "signal"<br>Insert: -- signals -- |
| Column 5, Line 64 | Delete: "receive"<br>Insert: -- receives -- |
| Column 5, Line 64 | Delete: "a" |
| Column 8, Line 48 | Delete: "for"<br>Insert: -- far -- |
| Column 9, Line 11 | Delete: "delays"<br>Insert: -- delay -- |
| Column 10, Line 19 | Delete: "modulator deliver"<br>Insert: -- modulator to deliver -- |
| Column 10, Line 27 | Delete: "to" |

Signed and Sealed this
Tenth Day of April, 2012

David J. Kappos
*Director of the United States Patent and Trademark Office*